United States Patent
Kanno

[19]

[11] Patent Number: 5,961,168
[45] Date of Patent: Oct. 5, 1999

[54] PICK AND PLACE APPARATUS FOR TRANSFERRING OBJECTS

[75] Inventor: Yukio Kanno, Ootone-machi, Japan

[73] Assignee: Advantest Corp., Tokyo, Japan

[21] Appl. No.: 08/944,758

[22] Filed: Oct. 6, 1997

[30] Foreign Application Priority Data

Oct. 16, 1996 [JP] Japan ................................. 8-273508

[51] Int. Cl.⁶ ................................................. B25J 15/06
[52] U.S. Cl. ........................... 294/64.1; 294/907; 901/46
[58] Field of Search ........................... 294/64.1–65, 907; 901/40, 46; 414/627, 737, 752; 29/743

[56] References Cited

U.S. PATENT DOCUMENTS

| | | | |
|---|---|---|---|
| 3,008,747 | 11/1961 | Lytle | 294/64.1 |
| 3,782,560 | 1/1974 | Kahwati et al. | 294/64.1 |
| 3,918,593 | 11/1975 | Kaufeldt . | |
| 4,116,348 | 9/1978 | Atchley et al. . | |
| 4,252,497 | 2/1981 | Burt . | |
| 4,261,681 | 4/1981 | Gates . | |
| 4,653,741 | 3/1987 | Palmer | 294/64.1 |
| 5,470,117 | 11/1995 | Schmidt | 294/64.1 |

FOREIGN PATENT DOCUMENTS

| | | | |
|---|---|---|---|
| 2324460 | 11/1973 | Germany . | |
| 1212-911 | 2/1986 | U.S.S.R. | 294/64.1 |
| 1278-287 | 12/1986 | U.S.S.R. | 294/64.1 |

OTHER PUBLICATIONS

Western Electric Technical Digest, No. 40, Oct. 1975.

Primary Examiner—Dean J. Kramer
Attorney, Agent, or Firm—Muramatsu & Associates

[57] ABSTRACT

A pick and place apparatus for picking, transferring and placing an object which is capable of performing picking and placing operations with high stability and high speed without causing a jamming. The pick and place apparatus has a negative pressure source therein and includes a first pressure detector for detecting suction condition in a process for picking up an object by applying a negative pressure from the negative pressure source, a second pressure detector for detecting suction-release condition in a process for placing the object on a predetermined position by releasing the negative pressure, and a controller for controlling an overall operation of the pick and place apparatus to proceed to the next procedure upon receiving a suction detection signal from the first pressure detector or a suction-release detection signal from the second pressure detector.

8 Claims, 7 Drawing Sheets

(a)

(b)

(a)

(b)

(c)

PICK AND PLACE APPARATUS FOR TRANSFERRING OBJECTS

BACKGROUND OF THE INVENTION

This invention relates to a pick and place apparatus for transferring objects, and more particularly, a pick and place apparatus that performs suction or suction-release by opening and closing of a negative pressure source for transferring objects such as semiconductor devices.

Some applications of a pick and place apparatus for transferring objects require to transfer objects precisely and quickly in order to increase the operating efficiency of an overall system. One such example arises where a pick and place apparatus employed in a test handler incorporated with a semiconductor test system for transferring test objects. In such a test handler accompanied by a semiconductor system, the test objects to be transferred are semiconductor IC devices. Other example is a chip mounter that places various electric components in a chip form on predetermined positions of a printed circuit board and the like. This invention relates to a pick and place apparatus having a suction mechanism for attracting and releasing the objects to be transferred with a suction force produced by a negative pressure such as vacuum.

These pick and place apparatuses are required to have high efficiency to improve an overall productivity with a high transfer speed and high reliability with a low jamming rate. To achieve these objectives, in a pick and place apparatus for transferring the objects by using the suction method, a pressure detection means is provided for each suction pad for detecting the suction condition. This assures the pick-up operation (suction) by detecting the suction pressure and promotes reduction of the suction (pick-up operation) time or the suction-release (place operation) time.

An example of structure in such a pick and place apparatus is explained with reference to FIG. 5. This example controls suction and suction release operations through detection signals from a pressure detector 41. Further in this example, a plurality of devices under test (DUT) to be transferred by the pick and place apparatus are arranged on a horizontal tray.

In FIG. 5, the pick and place apparatus having suction mechanism is comprised of a suction pad 30, a pad support 32, a transfer drive means 80, a vacuum hose 38, a pressure detector 41, a negative pressure switch 45, a negative pressure source 50, and a suction controller 70.

The suction pad 30 has a pad tip 31 that contacts DUT (Device Under Test) 90, and a through-hole 75 at the center for transmitting the negative pressure to the DUT 90 therethrough. The suction pad 30 is a circular component that can pick and place the DUT by the suction force produced by the negative pressure. Examples of suction pad 30 are shown in FIGS. 6(a)–6(c). The suction pad 30 is formed, for example, with an elastic rubber pad of FIG. 6(a), or an elastic rubber pad provided with a metallic-ring cover of FIG. 6(b), or elastic rubber with a metallic pipe as shown in FIG. 6(c). The vacuum hose 38 is connected at the top of the suction pad 30 to introduce the negative pressure to the pad tip 31 through the hole 75. The negative pressure switch 45 is connected, for example, to the other end of the vacuum hose 38 for performing on/off switch operations of the suction force.

This suction pad 30 can be freely positioned by the transfer drive means 80 in three directions through the pad supporter 32. For example, the suction pad 30 is driven by the transfer drive means 80 in a vertical direction (Z) for up and down movements, and in (X–Y) directions for right and left or forward and backward movements. Such a drive means is well known in the art, such as in a robot arm technology, and thus no further explanation is given here.

The pressure detector 41 detects predetermined pressure points for evaluating a pick and place operation and initiating the next switching operation of the suction force from the negative pressure source. The pressure points to be detected vary in accordance with the length of the vacuum hose 38, contact condition between the surface of the DUT 90 and the suction pad 30, or other factors. Detection signals from the pressure detector 41 indicating the pressure points are provided to the suction controller 70.

As an example of the negative pressure source 50, an ejector vacuum pump is generally used to produce a negative pressure based on a speed of fluid caused by the release of a high-pressure air into the atmosphere. The pressure detector 41, the negative pressure switch 45 and the negative pressure source 50 may be accommodated in one module in order to minimize the overall size.

Negative-pressure curves in the vacuum hose 38 with respect to the pick operation (suction period) and the place operation (suction-release period) are shown in FIG. 4. FIG. 4(a) is a negative pressure curve in the vacuum hose during the suction period. The negative pressure in the hose 38 fluctuates between the property curves C1a and C1b. The major factors for the cause of this fluctuations are pipe lengths of the vacuum hose 38, spaces and irregularities between the suction pad 31 and the DUT 90, as well as aged deteriorations. As a result, times T1a and T1b required to reach the predetermined suction pressure point P1 are also dispersed as shown in FIG. 4(a).

FIG. 4(b) is an example showing negative-pressure property curves in the vacuum hose 38 during the suction-release period. In this example, again, dispersion in the negative pressure is shown between the property curves C2a and C2b due to the similar factors mentioned above with respect to FIG. 4(a).

In view of the pressure dispersion described above, the suction procedure to pick up the DUT 90 on the tray 100 is explained in the following. In this example, it is assumed that the suction pressure point P1 which is a negative pressure value that can reliably and certainly maintain the suction of the DUT 90 is set in the pressure detector 41.

At the beginning of the suction period, the tip of the suction pad 30 is positioned so that the suction pad 30 is lightly pressed over the DUT 90 by the transfer drive means 80. The suction controller 70 turns the negative pressure switch 45 on to introduce the negative pressure in the vacuum hose 38. This situation is illustrated in FIG. 3 which shows a pressure transition during the suction period.

In the suction period shown in the left hand side of FIG. 3, as soon as the suction pressure P1 is detected by the pressure detector 41, the suction procedure is terminated by maintaining the pressure P1. The DUT 90 is held at the tip of the suction pad and the pick and place apparatus is proceeded to the next operation, such as transferring the DUT 90 to the destined position on the test handler. In this suction procedure, the DUT 90 is reliably maintained at the tip of the suction pad 30 without any time loss.

Next, the suction release operation for releasing the DUT 90 over a predetermined position is explained. The right hand side of FIG. 3 shows the pressure transition during the suction release period. After the DUT 90 is transferred to the predetermined position, such as a seat on the tray 100 of FIG. 5, the suction controller 70 turns the negative-pressure switch 45 off to decrease the negative pressure by introducing an atmospheric pressure in the vacuum hose 38.

Since the pressure detector 41 is provided with the suction pressure point P1 as noted above, it generates a detection signal when the negative pressure in the hose 38 is reduced to the pressure point Pi, although the DUT 90 is still attracted at the tip of the suction pad 30. Thus, a timer is provided which is activated by the detection signal from the pressure detector 41. The timer is set a time length which is assumed to be appropriate to release the DUT 90 with certainty. After a signal from the timer is received by the suction controller 70, the suction release procedure is terminated and the next procedure begins.

The time length in the timer is determined by taking into consideration of the dispersion of the negative pressure for successfully releasing the DUT and an operational margin for the successful releasing operation. Thus, the time set in the timer is longer than any anticipated situations in releasing the DUT. As a result, the differences are incurred between the actual timing for releasing the DUT 90 and the time length defined by the timer, which results in waste of time. On the other hand, if the time length is set to be shorter, a jamming of DUTs may occur and transfer reliability may be degenerated.

SUMMARY OF THE INVENTION

Therefore, it is an object of the present invention to produce a pick and place apparatus which is capable of picking and placing electronics devices at high speed and high efficiency with the use of a suction force.

It is another object of the present invention to provide a pick and place apparatus for picking electronics devices by applying a suction force and placing the devices by releasing the suction force at high speed without causing any jamming of the electronics devices.

It is a further object of the present invention to provide a pick and place apparatus which has a suction pressure detector and a suction release pressure detector separately from one another to independently detect predetermined pressure points of the negative pressure in the apparatus.

It is a further object of the present invention to provide a pick and place apparatus which has a pressure detector and an analog-to-digital converter to detect a suction point and a suction release point predetermined or modified by a software process.

It is a further object of the present invention to provide a pick and place apparatus which has a suction pressure detector and a suction release pressure detector separately from one another and at least one timer to determine end timings of the pick and place operations to proceed to the next operations of the apparatus.

In the first aspect of the present invention, the pick and place apparatus having a negative pressure source for transferring an object to perform suction and suction-release operations for picking and placing the object, includes: a first pressure detector for detecting suction condition in a process for picking up the object by applying a negative pressure; a second pressure detector for detecting suction-release condition in a process for placing the object on a predetermined position by releasing the negative pressure; and a controller for controlling an overall operation of the pick and place apparatus to proceed to the next procedure upon receiving a suction detection signal from the first pressure detector or a suction-release detection signal from the second pressure detector.

Because of the configuration above, a reliable picking operation during the suction period and a reliable releasing operation during the suction-release period can be achieved without causing any jamming of the objects.

In another aspect of the present invention, the pick and place apparatus for picking and placing an object by controlling a suction force, includes: a negative pressure source for generating the suction force for picking or releasing the object; a suction pad provided with the negative pressure source through a hose to contact the object for picking and placing the object by the suction force from the negative pressure source; a pressure switch for opening a path in the hose to supply the suction force to the suction pad or closing the path to prevent the suction force from supplying to the suction pad; a first pressure detector for detecting first predetermined negative pressure in the hose in a process for picking up the object; a second pressure detector for detecting second predetermined negative pressure in the hose in a suction-release for placing the object on a predetermined position; and a controller for controlling a switching operation of the pressure switch and an overall operation of the pick and place apparatus to proceed to the next procedure upon receiving a suction detection signal from the first pressure detector or a suction-release detection signal from the second pressure detector.

In the further aspect of the present invention, an analog to digital converter is used to convert the detected negative pressure to a digital signal for further prosecution by a controller. The pick and place apparatus for picking and placing an object by controlling a suction force, includes: a negative pressure source for generating the suction force to be applied to the object; a suction pad provided with the negative pressure source through a hose to contact the object for picking and placing the object by the suction force from the negative pressure source; a pressure switch for opening a path in the hose to supply the suction force to the suction pad or closing the path to prevent the suction force from supplying to the suction pad; a pressure detector for detecting negative pressure in the hose and generating an analog signal indicating an amount of the negative pressure; an analog-to-digital (A/D) converter for converting the analog signal from the pressure detector to a digital signal; and a controller for controlling a switching operation of the pressure switch and an overall operation of the pick and place apparatus to proceed to the next procedure upon receiving the digital signal from the A/D converter and evaluating the digital signal to see whether the negative pressure reaches predetermined pressure points indicating successful picking or releasing operations of the object.

In the further aspect of the present invention, a timer is used to determine the timings of the pick and/or release operation by an end signal of the timer for high speed and reliable operation in picking and place the object. The pick and place apparatus for picking and placing an object by controlling a suction force, includes: a negative pressure source for generating the suction force to be applied to the object; a first pressure detector for detecting first predetermined negative pressure in the hose in a process for picking up the object; a second pressure detector for detecting second predetermined negative pressure in the hose in a process for releasing the object on a predetermined position; a timer for generating an end signal predetermined time after receiving a detection signal from the first pressure detector or the second pressure detector; and a controller for controlling an overall operation of the pick and place apparatus to proceed to the next procedure upon receiving the end signal from the timer.

According to the present invention, the pressure detectors for detecting the suction condition and the suction-release condition, respectively, are independently provided. Thus, a reliable pick operation of the DUT is performed during the suction process, and a reliable release operation is performed during the suction-release process based on the respective detection signals. Further, by the timer which generates the end signal based on the detection signal from the pressure detector, a flexible and reliable operation for picking and releasing the DUT is carried out. As a result, the waste of time incurred by the timer in the conventional technology can be eliminated, and an overall transfer through-put can be significantly increased. In addition, suction reliability can be increased because of the reliable detection of the suction and suction-release conditions. Accordingly, unwanted jamming of the DUTs will not be incurred in the pick and place apparatus of the present invention.

DETAILED DESCRIPTION OF THE PREFERRED EMBODIMENTS

The pick and place apparatus of the present invention has a pressure detector for suction condition detection separately from a pressure detector for suction-release condition detection. The pick and place apparatus proceeds to the next step when receiving a detection signal indicating a successful pick-up operation or a detection signal indicating a successful placing operation by a suction control circuit.

Figure 1:
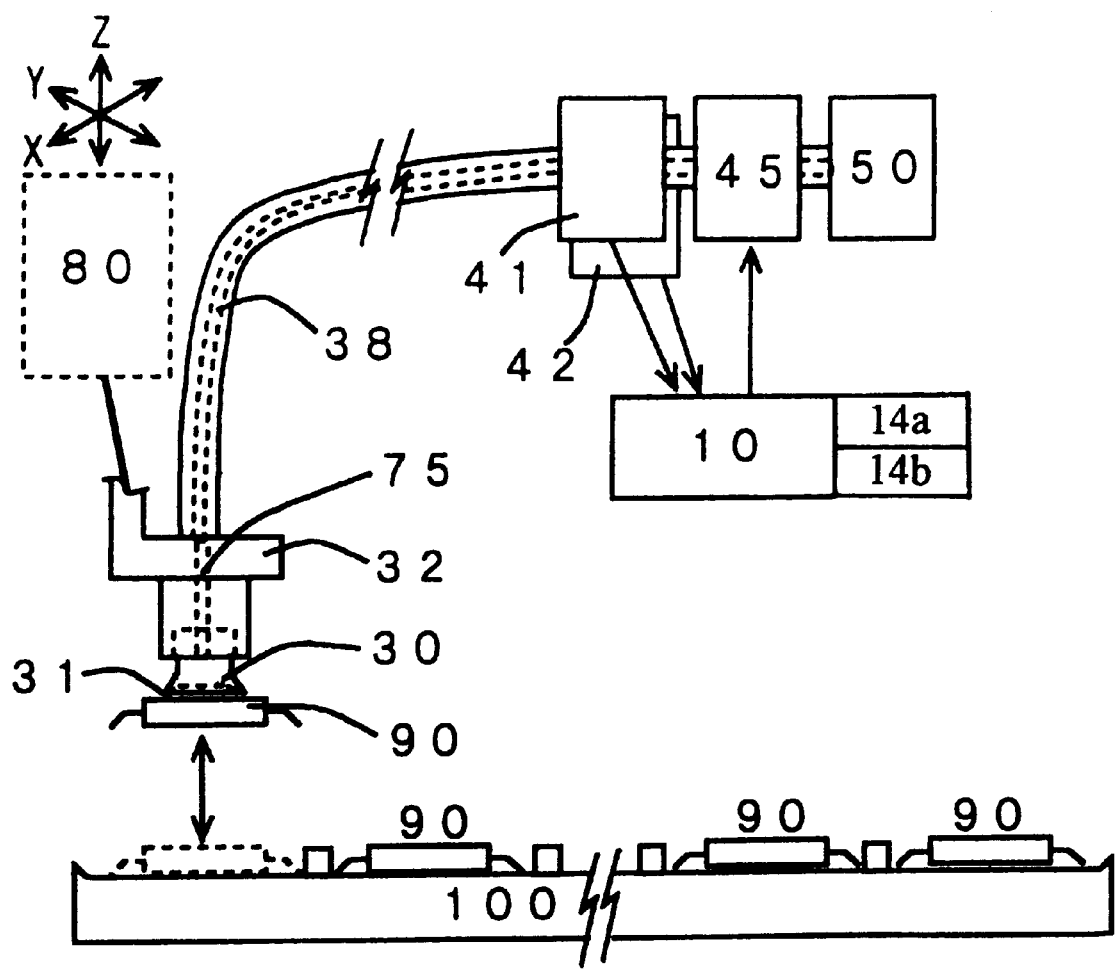
FIG. 1 is a block diagram showing a basic structure of the pick and place apparatus in the first embodiment of the present invention.

FIG. 1 shows a structure of the pick and place apparatus of the first embodiment of the present invention. The pick and place apparatus of FIG. 1 includes a suction pad 30, a pad support 32, transfer drive means 80, a vacuum hose 38, pressure detectors 41 and 42, a negative pressure switch 45, a negative pressure source 50, and a suction controller 10 having timers 14a and 14b. A typical example of the pressure detectors 41 and 42 is a semiconductor pressure sensor.

Figure 3:
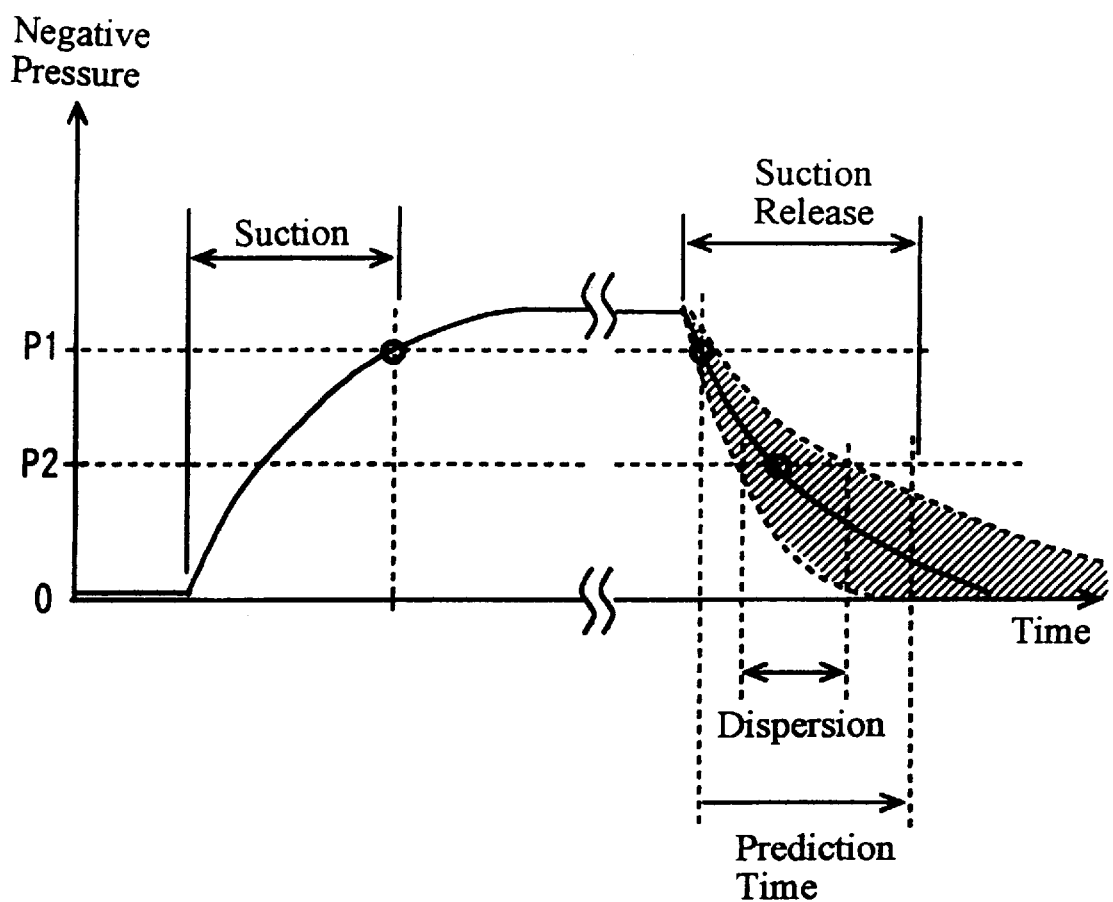
FIG. 3 is a block diagram showing an operation of the suction and suction release procedure in the conventional pick and place apparatus having a pressure detector therein.
Figure 4:
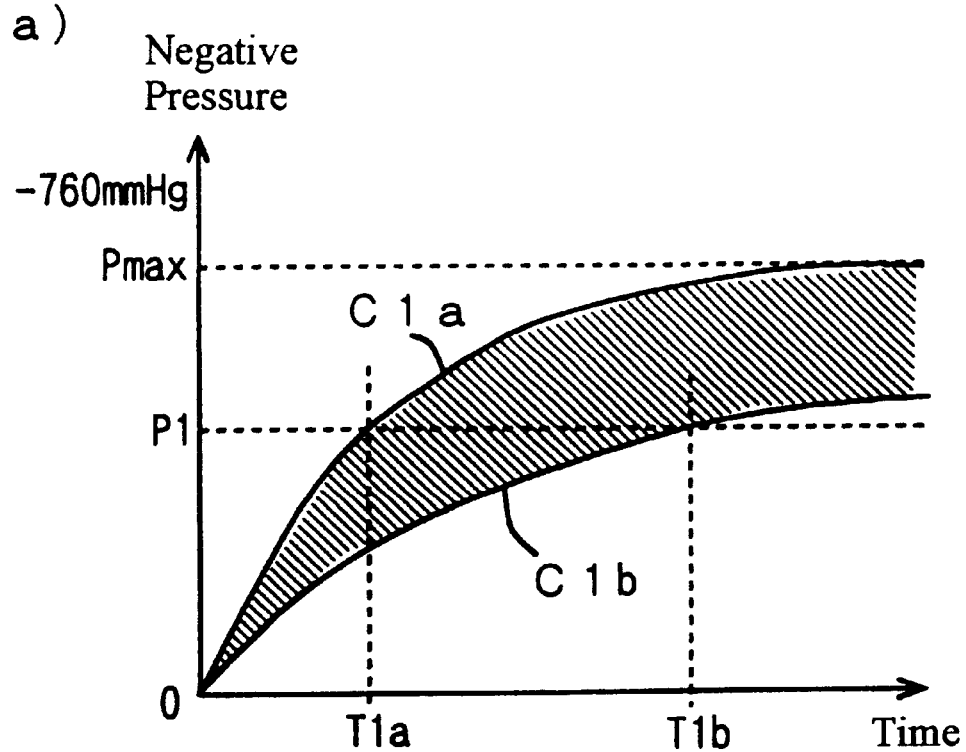
FIGS. 4(a) and 4(b) are block diagrams showing negative pressure property curves in a vacuum hose during the suction and suction-release periods.
Figure 4:
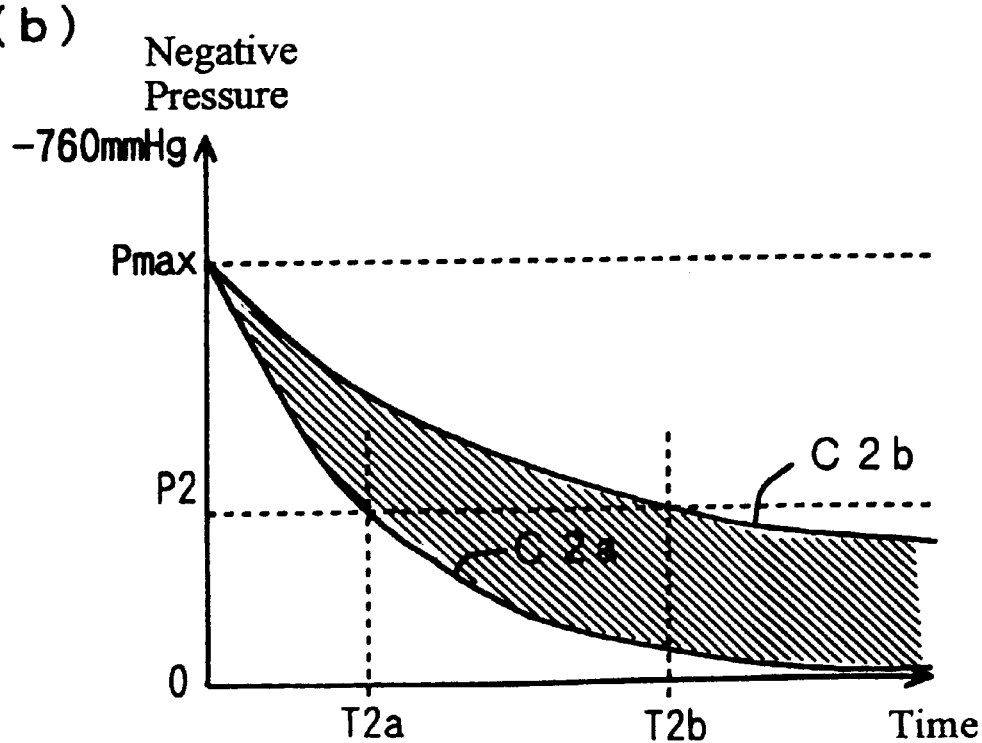
Figure 5:
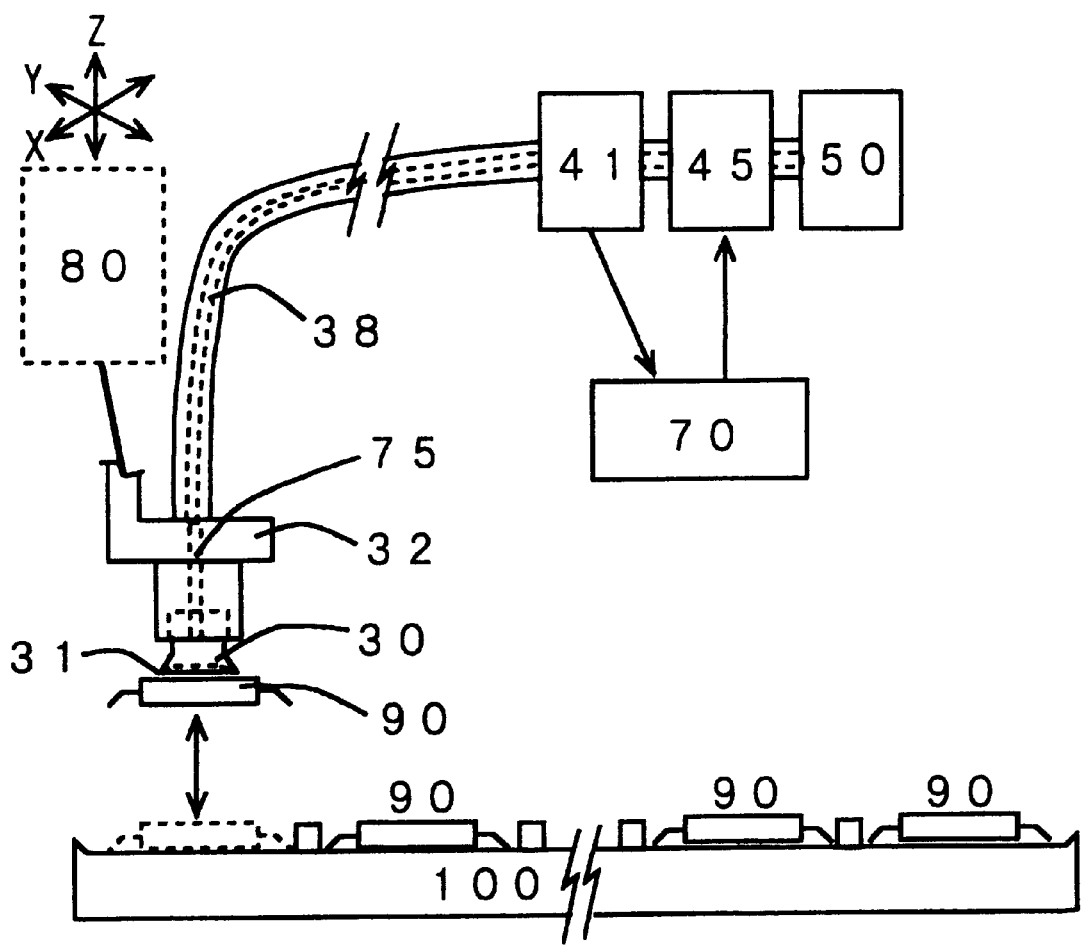
FIG. 5 is a block diagram showing a basic structure of the pick and place apparatus in the conventional technology.
Figure 6:
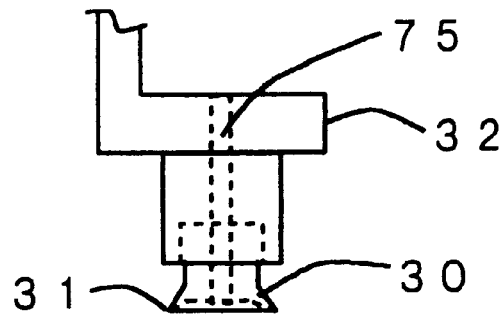
FIGS. 6A–6C are block diagrams showing examples of structure of a suction pad of the pick and place apparatus.
Figure 6:
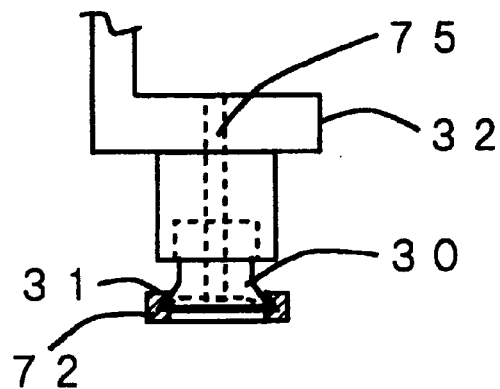
Figure 6:
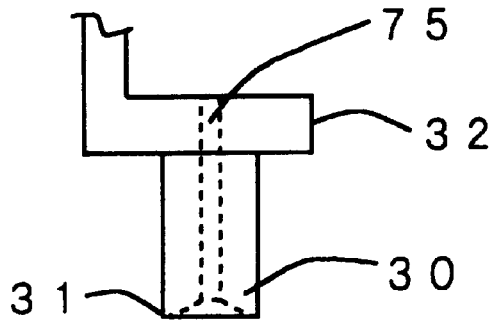

The pressure detector 41 is to detect the negative pressure in the suction period for picking a device under test (DUT) 90 on a tray 100. In the pressure detector 41, the pressure point P1 in FIGS. 3 or 4(a) is set so that the DUT 90 is securely picked by the suction pad 30. When the tip of the suction pad 30 is positioned on the DUT 90 by the transfer drive means 80, the suction controller 10 turns on the negative pressure switch 45 and introduces the negative pressure in the vacuum hose 38.

In this suction period, the pressure in the vacuum hose 38 increases in a manner shown in FIG. 3. When the pressure in the vacuum hose 38 reaches the pressure point P1, the pressure detector 41 generates a detection signal which is received by the suction controller 10. Then the suction controller 10 determines that the DUT 90 is securely picked up and instructs the apparatus to proceed to the next movement of the pick and place apparatus.

The pressure detector 42 is to detect the negative pressure in the suction period for placing the DUT 90 on a predetermined position such as a seat on the tray 100 of FIG. 1. In the pressure detector 42, the pressure point P2 in FIGS. 3 or 4(b) that can securely release the DUT 90 is set. After the DUT 90 is transferred at the predetermined position, the suction controller 10 turns off the negative-pressure switch 45. When the pressure in the vacuum hose 38 decreases to the pressure point P2, the pressure detector 42 generates a detection signal which is received by the suction controller 10. Then the suction controller 10 determines that the DUT 90 is successfully released from the suction pad 30 and instructs the apparatus to proceed to the next step of the pick and place operation.

In the pick and place apparatus in the foregoing, the pressure detectors 41 and 42 separately detect the pressure points P1 and P2 to pick and release the DUT 90. Thus, unstable and unreliable factors such as the estimated time length in the timer in the conventional technology are not involved in the operation of the present invention. Thus, the operational reliability and stability in the suction and suction-release procedures are improved, which also increases overall throughput of the device transfer.

Figure 2:
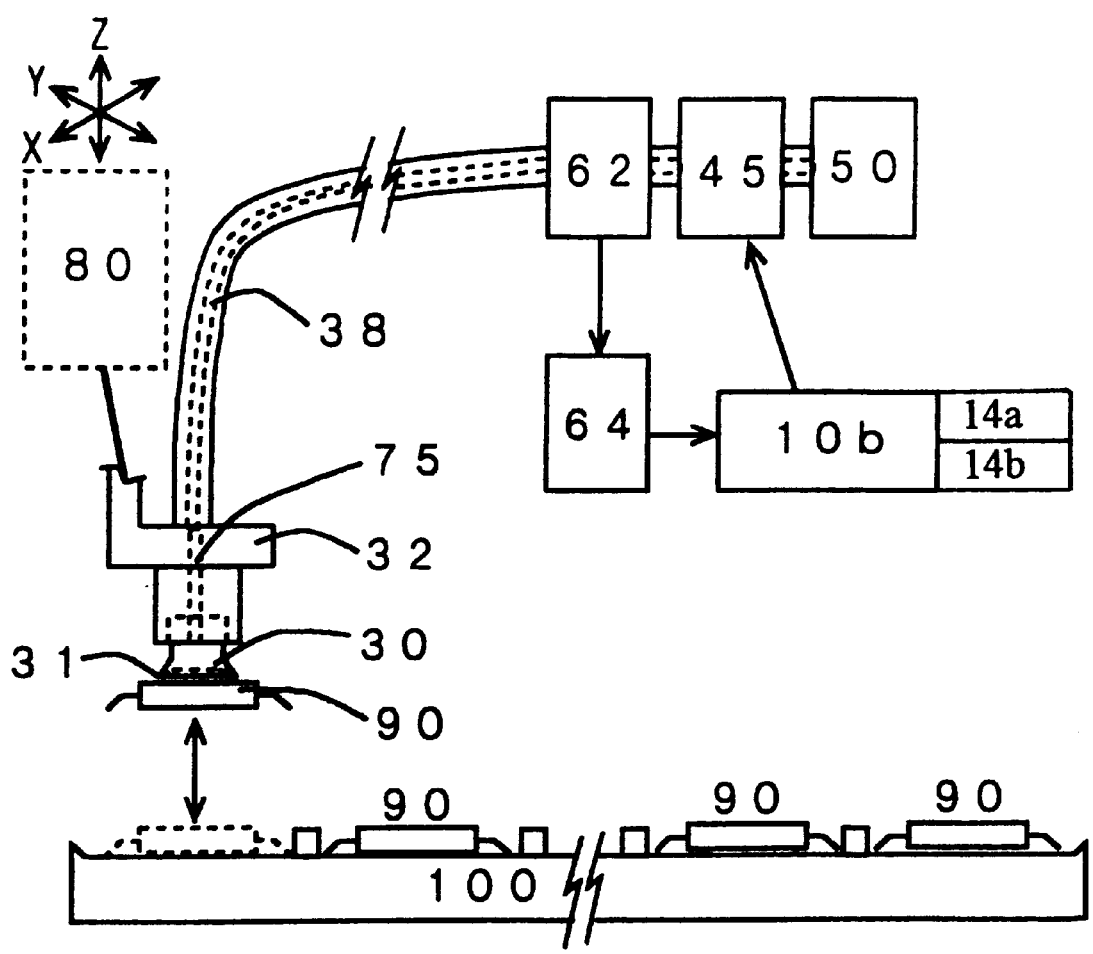
FIG. 2 is a block diagram showing a basic structure of the pick and place apparatus in the second embodiment of the present invention.

The pick and place apparatus in the second embodiment of the present invention is shown in FIG. 2. The second embodiment of the present invention includes a suction pad 30, a pad support 32, transfer drive means 80, a vacuum hose 38, a pressure detector 62, an analog-digital (AD) converter 64, a negative pressure switch 45, a negative pressure source 50, and a suction controller 10b having timers 14a and 14b as shown in FIG. 2.

Preferably, the pressure detector 62 is an analog semiconductor pressure sensor which generates an analog output signal. The analog output signal is proportional to the pressure in the vacuum hose 38 and is received by the AD converter 64. The AD converter 64 converts the received signal to a digital signal representing the negative pressure signal in the vacuum hose 38 which is provided to the suction controller 10b.

When receiving the digital signal from the AD converter 64, the suction controller lob compares the received data with the preset data indicating the negative pressure of the suction point or the suction release point. After detecting the predetermined pressure points, the controller 10b controls the apparatus to move to the next procedure. More specifically, in the suction period, when detecting the negative pressure point P1, the pick and place apparatus shifts to the next operational process. In the suction release period, when detecting the negative pressure point P2, the pick and place apparatus shifts to the next operational process. In this example, the pressure point P1 or the suction-release pressure point P2 can be set or modified through a software process.

Figure 7:
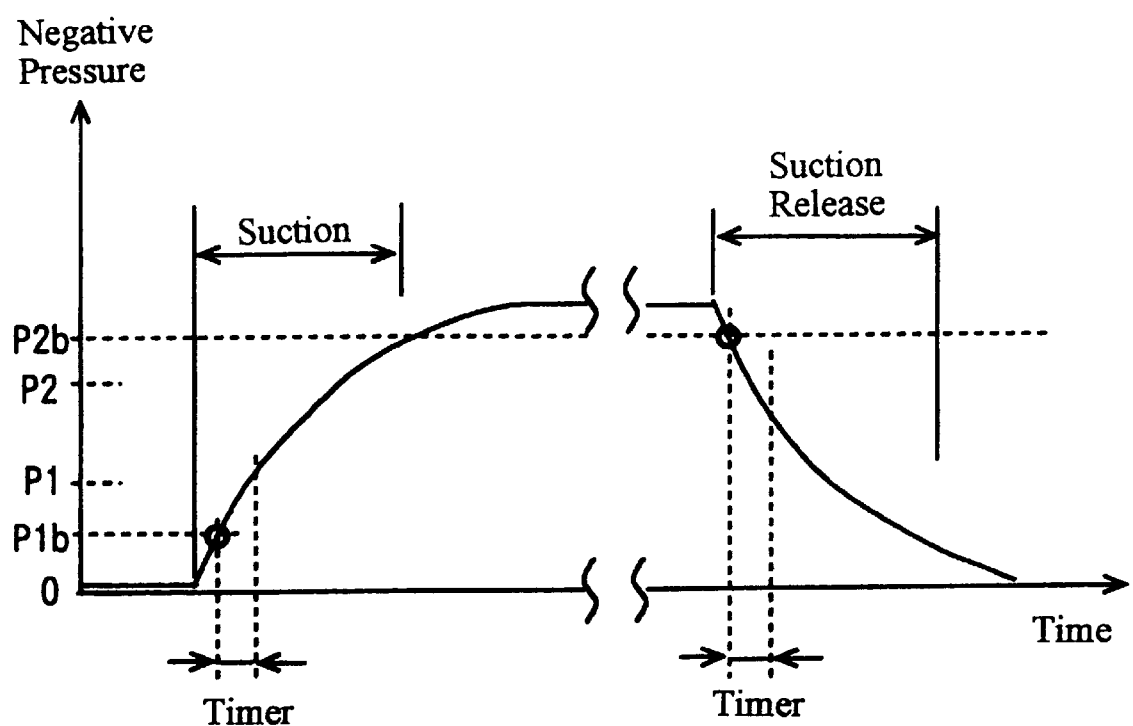
FIG. 7 is a block diagram showing an operation of the suction and suction release procedure using the timers in the pick and place apparatus of the present invention.

The above embodiment explains the case wherein the suction condition and the suction-release condition are determined by the detection signals from the pressure detectors 41 and 42. The third embodiment of the present invention further includes timers to flexibly control the timings for the suction and suction-release. FIG. 7 is a schematic diagram for explaining the timings of the suction and suction-release operations when using the timers in addition to the pressure detectors 41 and 42. Such timers 14a and 14b may be included in the suction controller 10 as shown in FIGS. 1 and 2.

In the example of FIG. 7, a pressure point P1b is set in the pressure detector 41. The pressure point P1b is slightly lower than P1 which is a pressure point where the DUT 90 is picked with certainty by the pick and place apparatus. When a detection signal is generated by the pressure detector 41, the timer 14a in FIGS. 1 or 2 starts counting the time for a predetermined time period which is short enough to end around the pressure point P1 to securely pick-up the DUT 90.

After the time set in the timer 14a has elapsed, the suction controller 10 determines that the DUT 90 is picked, and instructs the pick and place apparatus to proceed to the next operation. In this embodiment, by adjusting the time length in the timer 14a to end in the vicinity of the pressure point P1, the suction timing for the pick operation can be flexibly adjusted corresponding to the variations of the components, such as the vacuum hose, forming the pick and place apparatus and surface conditions of the DUTs.

Similar to the pick up (suction) process in the foregoing, in the release (suction-release) process, a pressure point P2b is set in the pressure detector 42. The pressure point P2b is slightly higher than the pressure P2 which is the point where the DUT 90 is released with certainty from the pick and place apparatus. When a detection signal is generated by the pressure detector 42, the timer 14b in FIGS. 1 or 2 starts counting the time for a predetermined time period which is short enough to end around the pressure point P2 to release the DUT 90.

After the time set in the timer 14b has elapsed, the suction controller 10 determines that the DUT 90 is released from the pick and place apparatus, and instructs the pick and place apparatus to proceed to the next operation. In this embodiment, by adjusting the time length in the timer 14b to end in the vicinity of the pressure point P1, the suction timing for the pick operation can be flexibly adjusted corresponding to the variations of the components forming the pick and place apparatus and surface conditions of the DUTs.

As in the foregoing, in the third embodiment of the present invention, by using the two pressure detectors 41 and 42 and the two timers 14a and 14b, the pick and place operations are accurately performed as well as the end timings of the pick operation and the place operation are determined separately from the other. Therefore, the pick and place apparatus of the present invention can operate with high speed and high efficiency without causing the jamming of the devices.

In the above embodiment, the preset time values in the timers 14a and 14b are much smaller than the prediction time length in the timer used in the conventional technology. Thus, the time loss due to the dispersion and variations of components can be significantly small. In the above example, the two timers 14a and 14b are used in combination with the pressure detectors 41 and 42. However, only one timer can be used in either one of the pick or place operation.

The above embodiment has been explained for the case wherein the transfer drive means 80 is connected to the suction pad 30 to move the suction pad in the three (X, Y and Z) dimensions. However, it is possible to provide such a three dimensional driver to the tray 100 while the suction pad 30 is fixed in a certain position. In the above embodiment, the transfer drive means 80 is provided in one to one relationship with the suction pad 30. However, it is also possible to drive a plurality of suction pads by one mechanism of the transfer drive means 80.

The present invention achieves the following effect due to the configuration explained above.

The pressure detectors for detecting the suction condition and the suction-release condition, respectively, are independently provided. Thus, a reliable pick operation of the DUT is performed during the suction process, and a reliable release operation is performed during the suction-release process based on the respective detection signals. Further, by the timer which generates the end signal based on the detection signal from the pressure detector, a flexible and reliable operation for picking and releasing the DUT is carried out. As a result, the waste of time incurred by the timer in the conventional technology can be eliminated, and an overall transfer through-put can be significantly increased. In addition, suction reliability can be increased because of the reliable detection of the suction and suction-release conditions. Accordingly, unwanted jamming of the DUTs will not be incurred in the pick and place apparatus of the present invention.

What is claimed is:

1. A pick and place apparatus of an IC test handler having a negative pressure source using a vacuum ejector for transferring an object and for performing suction and suction-release operations to pick and place the object, comprising:

a first pressure detector for detecting first predetermined negative pressure in a hose in a suction process for picking up said object by applying a negative pressure;

a second pressure detector for detecting second predetermined negative pressure in said hose in a suction-release process for placing said object on a predetermined position by releasing said negative pressure; and a controller for controlling an overall operation of the pick and place apparatus to proceed to the next procedure immediately upon receiving a suction detection signal from said first pressure detector or a suction-release detection signal from said second pressure detector.

2. A pick and place apparatus of an IC test handler as defined in claim 1, further comprising:

a suction pad provided with said negative pressure source through a hose to contact said object for picking and placing said object by said suction force; and a pressure switch for opening a path in said hose to supply said suction force to said suction pad or closing said path to prevent said suction force from supplying to said suction pad.

3. A pick and place apparatus of an IC test handler as defined in claim 2, further comprising:

a position controlling means directly connected to said suction pad for positioning said suction pad in vertical and horizontal directions.

4. A pick and place apparatus of an IC test handler for picking and placing an object by controlling a suction force, comprising:

a negative pressure source using a vacuum elector for generating said suction force for picking or releasing said object;

a suction pad provided with said negative pressure source through a hose to contact said object for picking and placing said object by said suction force from said negative pressure source;

a pressure switch for opening a path in said hose to supply said suction force to said suction pad or closing said path to prevent said suction force from supplying to said suction pad;

a first pressure detector for detecting first predetermined negative pressure in said hose in a process for picking up said object;

a second pressure detector for detecting second predetermined negative pressure in said hose in a suction-release process for placing said object on a predetermined position; and a controller for controlling a switching operation of said pressure switch and an overall operation of the pick and place apparatus to proceed to the next procedure immediately upon receiving a suction detection signal from said first pressure detector or a suction-release detection signal from said second pressure detector.

5. A pick and place apparatus of an IC test handler as defined in claim 4, further comprising:

a position control means directly connected to said suction pad for positioning said suction pad in vertical and horizontal directions.

6. A pick and place apparatus for picking and placing an object by controlling a suction force, comprising:

a negative pressure source for generating said suction force to be applied to said object;

a first pressure detector for detecting first predetermined negative pressure in said hose in a process for picking up said object;

a second pressure detector for detecting second predetermined negative pressure in said hose in a release process for releasing said object on a predetermined position;

a timer for generating an end signal at predetermined time after receiving a detection signal from said first pressure detector or said second pressure detector;

a controller for controlling an overall operation of the pick and place apparatus to proceed to the next operational procedure upon receiving said end signal from said timer.

7. A pick and place apparatus as defined in claim 6, further comprising:

a suction pad provided with said negative pressure source through a hose to contact said object for picking and placing said object by said suction force from said negative pressure source; and a pressure switch for opening a path in said hose to supply said suction force to said suction pad or closing said path to prevent said suction force from supplying to said suction pad;

wherein an operation of said pressure switch is controlled by said controller in response to said end signal from said timer.

8. A pick and place apparatus as defined in claim 6, further comprising:

a position control means for positioning said suction pad in vertical and horizontal directions.

* * * * *